US012800612B2

(12) United States Patent
Choi

(10) Patent No.: US 12,800,612 B2
(45) Date of Patent: Nov. 17, 2026

(54) PROBE PIN FOR INSPECTION APPARATUS

(71) Applicant: QUALMAX, INC., Hwaseong-si (KR)

(72) Inventor: Jong Kook Choi, Seongnam-si (KR)

(73) Assignee: QUALMAX, INC., Hwaseong-si (KR)

( * ) Notice: Subject to any disclaimer, the term of this patent is extended or adjusted under 35 U.S.C. 154(b) by 139 days.

(21) Appl. No.: 18/856,615

(22) PCT Filed: Feb. 8, 2023

(86) PCT No.: PCT/KR2023/001832
§ 371 (c)(1),
(2) Date: Oct. 13, 2024

(87) PCT Pub. No.: WO2023/200094
PCT Pub. Date: Oct. 19, 2023

(65) Prior Publication Data

US 2025/0251422 A1 Aug. 7, 2025

(30) Foreign Application Priority Data

Apr. 13, 2022 (KR) ........................ 10-2022-0045634

(51) Int. Cl.
*G01R 1/067* (2006.01)

(52) U.S. Cl.
CPC ................................ *G01R 1/06722* (2013.01)

(58) Field of Classification Search
CPC ........................................... G01R 1/06–06722
USPC ............................ 324/755.01, 755.04–755.6
See application file for complete search history.

(56) References Cited

U.S. PATENT DOCUMENTS

| | | | | |
|---|---|---|---|---|
| 2012/0043987 A1* | 2/2012 | Lou | G01R 1/06716 |
| | | | 324/756.03 |
| 2017/0054240 A1* | 2/2017 | Lee | G01R 1/06722 |
| 2020/0064373 A1* | 2/2020 | Treibergs | G01R 1/06722 |
| 2023/0349950 A1* | 11/2023 | Ota | G01R 1/06722 |

FOREIGN PATENT DOCUMENTS

| | | |
|---|---|---|
| KR | 10-1194520 B1 | 10/2012 |
| KR | 10-1388878 B1 | 4/2014 |
| KR | 10-2017-0119469 A | 10/2017 |
| KR | 10-1962644 B1 | 3/2019 |
| KR | 10-2021-0111774 A | 9/2021 |

* cited by examiner

*Primary Examiner* — Alesa Allgood
*Assistant Examiner* — Rahul Maini
(74) *Attorney, Agent, or Firm* — Bridgeway IP Law Group, PLLC; Sang Ho Lee; Hyun Woo Shin

(57) ABSTRACT

Provided is an integrated probe pin that includes an upper plunger having a first tip adapted to come into contact with a circuit to be inspected to transmit and receive electrical signals to and from the circuit to be inspected; a lower plunger having a second tip adapted to come into contact with an inspection circuit to transmit and receive the electrical signals to and from the inspection circuit; and an elastic part located between the upper plunger and the lower plunger to elastically support the upper plunger and the lower plunger, wherein the upper plunger, the lower plunger, and the elastic part are manufactured as an integral body using 3D printing and made of one or more metal materials.

5 Claims, 9 Drawing Sheets

100

PROBE PIN FOR INSPECTION APPARATUS

TECHNICAL FIELD

The present invention relates to a probe pin for an inspection device, more specifically to an integrated probe for an inspection device that is capable of being manufactured using a 3D printer.

BACKGROUND ART

A process of manufacturing an object to be inspected, such as a semiconductor chip, includes an inspection step of measuring electrical characteristics of the object so as to check whether the object is defective. The inspection step needs an inspection circuit for measuring the electrical characteristics of the object and a probe pin for an inspection device that electrically connects a contact point to be inspected formed on the object with an inspection point of the inspection circuit.

FIG. 1 shows a conventional probe pin for an inspection device. Referring to FIG. 1, a probe pin 10 includes an upper plunger 11 and a lower plunger 12 as metal conductors having the shapes of thin rods, a barrel 13 for receiving a portion of the upper plunger 11 and a portion of the lower plunger 12, and a spring 14 located inside the barrel 13 to elastically support the upper plunger 11 and the lower plunger 12 so that the upper plunger 11 and the lower plunger 12 are stretchable.

Typically, the probe pin 10 is manufactured by coupling the upper plunger 11, the lower plunger 12, the barrel 13, and the spring 14 manufactured independently to one another. In this case, the manufacturing process from machining to coupling takes a lot of time, so that a manufacturing cost of the probe pin increases to cause a price of the probe pin to be raised. Further, contact resistance occurs as the respective parts are coupled to one another, thereby having bad influences on the performance of the probe pin 10.

DISCLOSURE OF THE INVENTION

Technical Problem

Accordingly, the present invention has been made in view of the above-mentioned problems occurring in the related art, and it is an object of the present invention to provide an integrated probe pin for an inspection device that is capable of minimizing the occurrence of contact resistance, while operating, thereby enhancing inspection performance.

Technical Solution

An integrated probe pin according to an embodiment of the present invention may include an upper plunger having a first tip adapted to come into contact with a circuit to be inspected to transmit and receive electrical signals to and from the circuit to be inspected; a lower plunger having a second tip adapted to come into contact with an inspection circuit to transmit and receive the electrical signals to and from the inspection circuit; and an elastic part located between the upper plunger and the lower plunger to elastically support the upper plunger and the lower plunger, wherein the upper plunger, the lower plunger, and the elastic part may be manufactured as an integral body using 3D printing and made of one or more metal materials.

According to the embodiment of the present invention, the elastic part may form a current conduction path between the upper plunger and the lower plunger.

According to the embodiment of the present invention, the elastic part may include: a first layer having first concave portions and first convex portions alternately arranged to form a first ring; and a second layer having second concave portions and second convex portions alternately arranged to form a second ring.

According to the embodiment of the present invention, as the first concave portions may come into contact with the second convex portions and the first convex portions may come into contact with the second concave portions, the first ring and the second ring may form the current conduction path.

According to the embodiment of the present invention, the first tip may have the shape of a crown.

According to the embodiment of the present invention, the second tip may have the shape of a cone.

According to the embodiment of the present invention, the integrated probe pin may be manufactured to have a combined structure in which at least any one of a cylindrical structure and a plate structure is applied using an additive manufacturing (AM) method of the 3D printing.

According to the embodiment of the present invention, the integrated probe pin may be manufactured by machining a cylindrical metal pipe or rectangular metal plate using a substrative manufacturing (SM) method of the 3D printing.

Advantageous Effectiveness

According to the present invention, the probe pin for the inspection device is made as an integral body using the 3D printing, thereby minimizing contact resistance occurring due to coupling among the parts. Further, the probe pin is made of the metal material, thereby improving conductivity, stability, and durability thereof.

MODE FOR INVENTION

Hereinafter, embodiments of the present invention will be explained obviously and in detail below so that the present invention will be carried out easily by a person skilled in the art. Before the present invention is disclosed and described, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure.

Terms used in this application are used to only describe specific exemplary embodiments and are not intended to restrict the present invention. An expression referencing a singular value additionally refers to a corresponding expression of the plural number, unless explicitly limited otherwise by the context. In this application, terms, such as "comprise", "include", or 'have", are intended to designate those characteristics, numbers, steps, operations, elements, or parts which are described in the specification, or any combination of them that exist, and it should be understood that they do not preclude the possibility of the existence or possible addition of one or more additional characteristics, numbers, steps, operations, elements, or parts, or combinations thereof.

Terms, such as the first, the second, and the like may be used to describe various elements, but the elements should not be restricted by the terms. The terms are used to only distinguish one element from the other element.

Now, exemplary embodiments of the present invention will be described in detail below with reference to the accompanying drawings.

Figure 2:
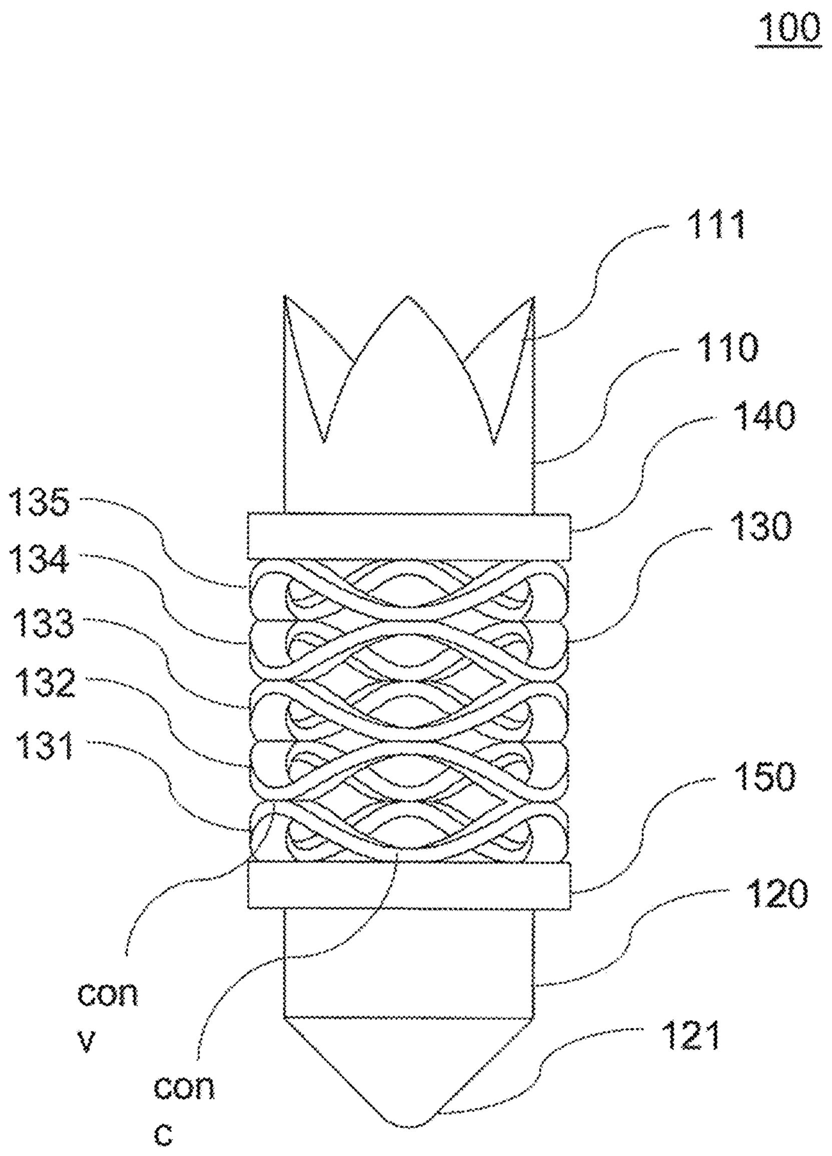
FIG. 2 shows a probe pin according to an embodiment of the present invention.

FIG. 2 shows a probe pin according to an embodiment of the present invention. Referring to FIG. 2, a probe pin 100 includes an upper plunger 110, a lower plunger 120, an elastic part 130, a first connector 140, and a second connector 150.

The probe pin 100 is manufactured as an integrated body. For example, the upper plunger 110, the lower plunger 120, the elastic part 130, the first connector 140, and the second connector 150 are not manufactured separately, but are manufactured integrally as one body. That is, the respective parts (the upper plunger 110, the lower plunger 120, the elastic part 130, the first connector 140, and the second connector 150) are made of the same material, and contact resistance between the adjacent parts does not exist or is minimized.

The upper plunger 110 is configured to transmit and receive electrical signals to and from a circuit to be inspected. To do this, the upper plunger 110 has a first tip 111. The first tip 111 is formed at one end of the upper plunger 110 and comes into contact with a contact point to be inspected of the circuit to be inspected. Referring to FIG. 2, the first tip 111 has the shape of a crown, but it may not be limited thereto. For example, the first tip 111 has various shapes such as a concave shape, a flat shape, a spherical shape, a conical shape, a point shape, a chisel shape, a tulip shape, and the like.

The lower plunger 120 is configured to transmit and receive the electrical signals to and from an inspection circuit. To do this, the lower plunger 120 has a second tip 121. The second tip 121 is formed at one end of the lower plunger 120 and comes into contact with an inspection contact point of the inspection circuit. Referring to FIG. 2, the second tip 121 has the shape of a point or cone, but it may not be limited thereto. For example, the second tip 121 has various shapes such as a concave shape, a flat shape, a spherical shape, a crown shape, a chisel shape, a tulip shape, and the like.

The elastic part 130 is located between the upper plunger 110 and the lower plunger 120 to provide an elastic force. For example, the elastic part 130 is configurated to be stretchable and serves to elastically support the upward and downward movements of the upper plunger 110 and the lower plunger 120. Further, the elastic part 130 is made of the same metal as the upper plunger 110 and the lower plunger 120, thereby forming a current conduction path between the upper plunger 110 and the lower plunger 120. According to the embodiment of the present invention, the elastic part 130 is called a spring.

According to the embodiment of the present invention, the elastic part 130 includes a plurality of layers 131, 132, 133, 134, and 135. The plurality of layers 131, 132, 133, 134, and 135 are stacked on one another and have the same shape. For example, each of the plurality of layers 131, 132, 133, 134, and 135 has the shape of a ring with concave portions and convex portions repeatedly formed. That is, each of the plurality of layers 131, 132, 133, 134, and 135 has a plurality of concave portions and a plurality of convex portions alternately arranged to form the ring. For example, each layer has three concave portions and three convex portions, but the number may not be limited thereto.

The first layer 131 is located at the bottom of the elastic part 130. The second layer 132 is located on top of the first layer 131. The concave portions of the second layer 132 come into contact with the convex portions (conv) of the first layer 131, and the convex portions of the second layer 132 come into contact with the concave portions (conc) of the first layer 131. The third to fifth layers 133, 134, and 135 are arranged similarly to the arrangement of the first layer 131 and the second layer 132, and therefore, detailed description thereof will be avoided.

Figure 3:
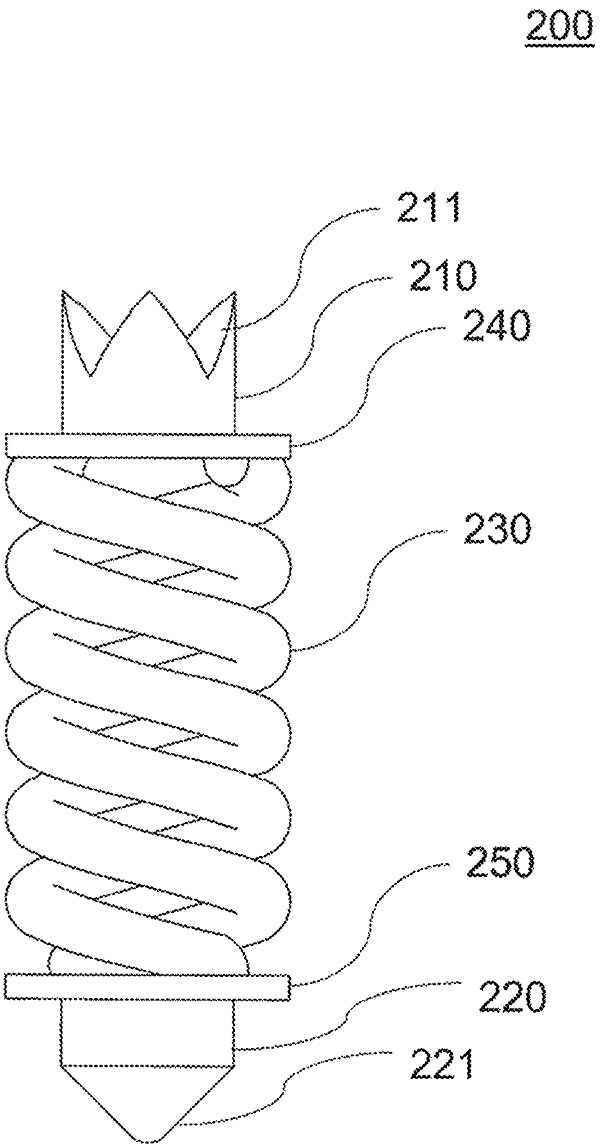
FIG. 3 shows a probe pin according to another embodiment of the present invention.

The first layer 131 has the sectional shape of a square. The elastic part 130 may be varied in shape or size according to embodiments of the present invention. For example, referring to FIG. 3, a probe pin 200 according to another embodiment of the present invention includes an elastic part 230 having the sectional shape of a circle. The probe pin 200 includes an upper plunger 210, a lower plunger 220, the elastic part 230, a first connector 240, and a second connector 250. Since the probe pin 200 is different in shape from the probe pin 100 as shown in FIG. 2 and the remaining parts thereof are similar to those of the probe pin 100, detailed descriptions on the remaining parts will be avoided.

The elastic part 230 has the shape of a general coil. The elastic part 230 provides a higher elastic force than the elastic part 130 as shown in FIG. 2. However, the elastic part 230 has a longer current conduction path than the elastic part 130 as shown in FIG. 2, thereby causing high resistance. Therefore, the elastic parts 130 and 230 may be varied in shape according to the purpose and object of the use of the probe pin.

Figure 1:
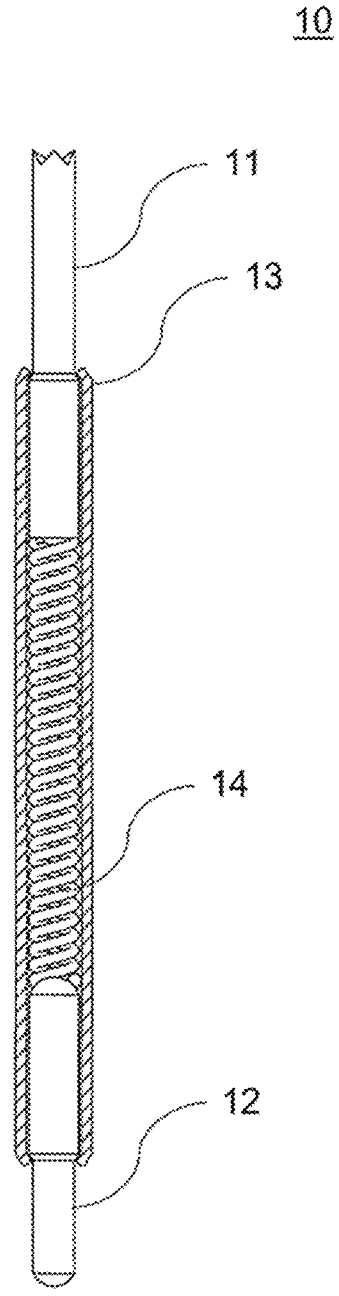
FIG. 1 shows a conventional probe pin for an inspection device.

Referring back to FIG. 2, the elastic part 130 forms the outer shape of the probe pin 100. That is, the probe pin 100 does not include a barrel (e.g., the reference numeral 13 of FIG. 1) surrounding the elastic part 130. Accordingly, the probe pin 100 is configured to have the spring located on the outer periphery thereof. In the case of such a structure, the probe pin 100 shows higher signal transmission characteristics than the conventional probe pin with the barrel.

The first connector 140 serves to connect the upper plunger 110 and the elastic part 130. The diameter of the first connector 140 is equal to the diameter of the elastic part 130 and greater than or equal to the diameter of the upper plunger 110. The second connector 150 serves to connect the lower plunger 120 and the elastic part 130. The diameter of the second connector 150 is equal to the diameter of the elastic part 130 and greater than or equal to the diameter of the lower plunger 120.

According to embodiments of the present invention, the first connector 140 and the second connector 150 may be omitted. In this case, the diameters of the upper plunger 110, the lower plunger 120, and the elastic part 130 are equal to one another.

According to the embodiment of the present invention, the probe pin 100 is manufactured using 3D printing. The 3D printing includes an additive manufacturing (AM) method and a substrative manufacturing (SM) method. The probe pin manufactured using the AM method is called an AM pin, and the probe pin manufactured using the SM method is called an SM pin. The AM pin and the SM pin are manufactured using 3D printing, so that they have minimal or no contact resistance, and each of them is made of one or more metal materials, so that they have high conductivity.

According to embodiments of the present invention, the respective components are made of the same metal material, and otherwise, they are made of different metal materials. For example, the upper plunger 110 and the lower plunger 120 are made of a first metal material, and the elastic part 130 is made of a second metal material. For another example, the upper plunger 110 is made of a first metal material, and the lower plunger 120 and the elastic part 130 are made of a second metal material. Like this, the metal materials of the respective parts may vary according to embodiments of the present invention. The metal materials include, for example, pure metal materials, such as copper (Cu), gold (Au), silver (Ag), iron (Fe), and the like as well as alloy materials, such as copper/nickel, copper/palladium, nickel/cobalt, brass (copper/zinc), bronze (copper/tin), and the like. Examples of the AM pin will be described below with reference to FIGS. 7 to 9, and examples of the SM pin will be described below with reference to FIGS. 4 to 6.

According to the embodiment of the present invention, the probe pin 100 is manufactured through Selective Laser Sintering (SLS) as the AM method that melts and stacks metal powder. The material of the probe pin 100 varies according to the purpose and environment of use of the pin. The method for manufacturing the probe pin 100 is not limited to the SLS, and all methods capable of performing metal 3D printing, such as Stereo-Lithography, laser cutting, and the like may be applied.

According to the embodiment of the present invention, the probe pin 100 is formed to have a given length or under. For example, the probe pin 100 is manufactured to a length of 0.5 mm or under. This is possible as the probe pin 100 is manufactured as an integrated body through metal 3D printing. Accordingly, the probe pin 100 is miniaturized, and the probe pin 100 is stabilized as a coupling or plating step is omitted. Furthermore, the inspection device is also miniaturized and stabilized.

Figure 4:
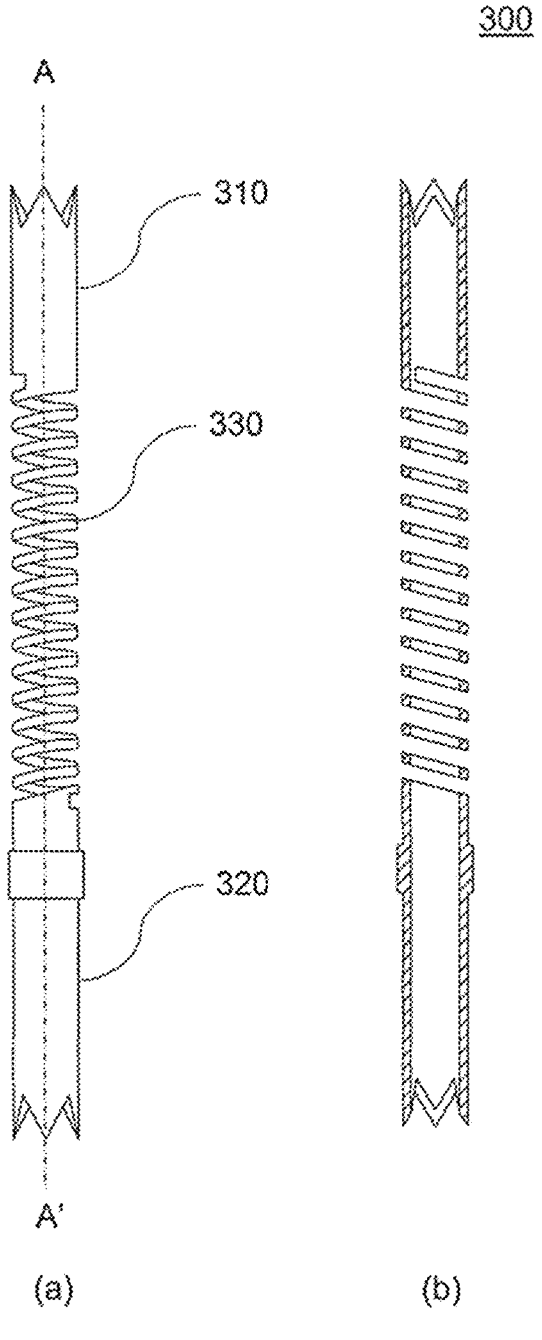
FIGS. 4 to 6 show examples of the probe pin manufactured using a substrative manufacturing (SM) method.
Figure 5:
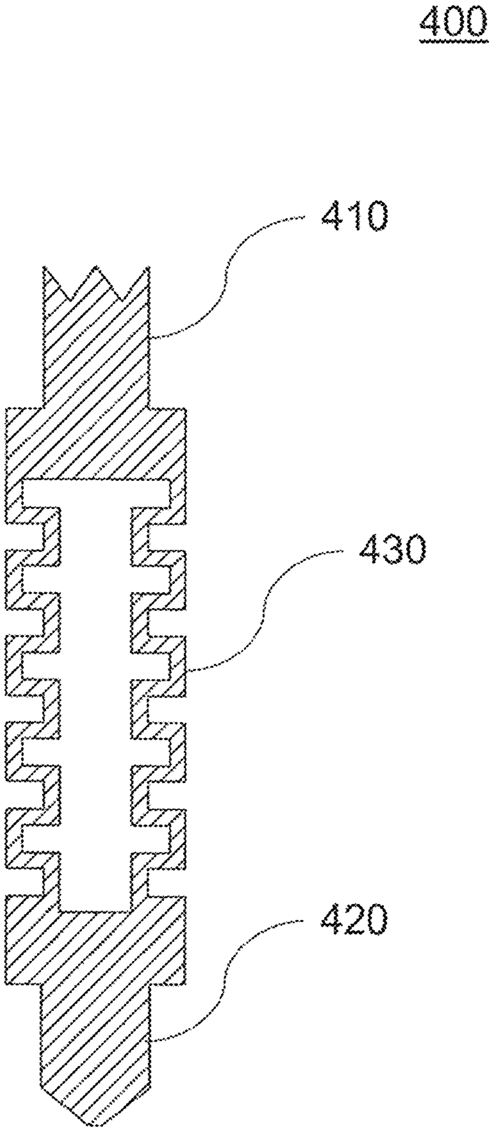
Figure 6:
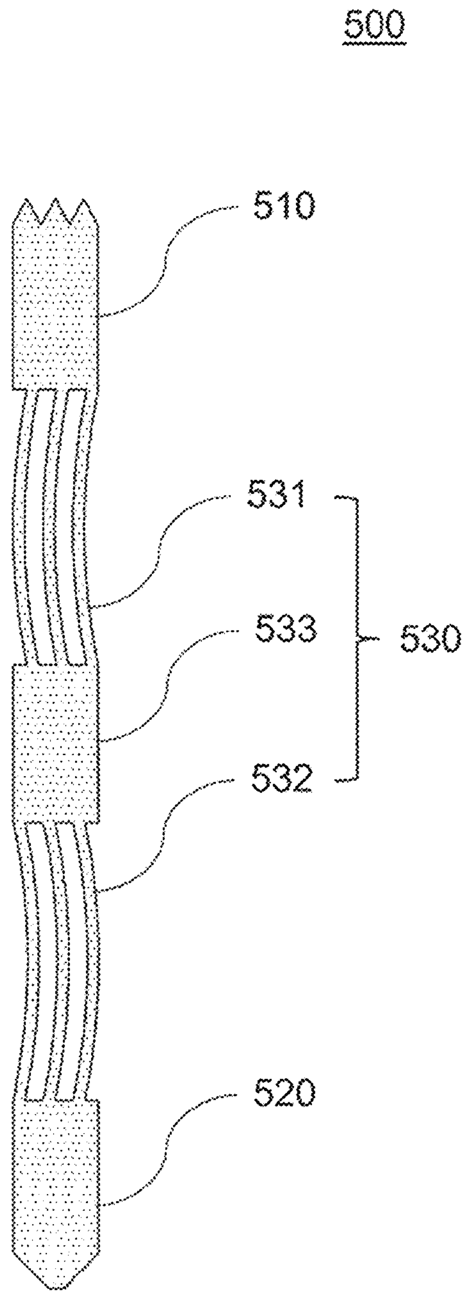

FIGS. 4 to 6 show examples of the probe pin made using the substrative manufacturing (SM) method. FIGS. 4*a* and 4*b* are front and sectional views of an integrated SM pin 300, and FIGS. 5 and 6 are front views showing plate-shaped integrated SM pins 400 and 500.

Referring to FIGS. 4*a* and 4*b*, FIG. 4*a* is a front view of the integrated SM pin 300, and FIG. 4*b* is a sectional view taken along the line A-A' of the integrated SM pin 300. The integrated SM pin 300 includes an upper plunger 310, a lower plunger 320, and an elastic part 330. Since the upper plunger 310, the lower plunger 320, and the elastic part 330 are similar to the upper plunger 110, the lower plunger 120, and the elastic part 130 of FIG. 2, a detailed description on the parts will be avoided.

According to the embodiment of the present invention, the integrated SM pin 300 is manufactured through laser processing of the 3D printing. The integrated SM pin 300 is manufactured by applying laser cutting to a cylindrical metal pipe. Referring to FIGS. 4*a* and 4*b*, the upper plunger 310 and the lower plunger 320 have crown-shaped tips, but the shapes of the tips may not be limited thereto.

Referring to FIGS. 5 and 6, the integrated SM pins 400 and 500 have the shapes of plates. The integrated SM pins 400 and 500 are manufactured through laser processing of the 3D printing. The integrated SM pins 400 and 500 are manufactured by applying laser cutting to a rectangular metal plate. The shapes of the tips and the shapes of the elastic parts may vary according to embodiments of the present invention.

Referring to FIG. 5, the integrated SM pin 400 includes an upper plunger 410, a lower plunger 420, and an elastic part 430. Since the upper plunger 410 and the lower plunger 420 are similar to the upper plunger 110 and the lower plunger 120 of FIG. 2, a detailed description on the parts will be avoided.

The elastic part 430 is located between the upper plunger 410 and the lower plunger 420 to elastically support the upward and downward movements of the upper plunger 410 and the lower plunger 420. The elastic part 430 includes a plurality of elastic members. Each elastic member has a concavo-convex pattern in which a plurality of protrusions are spaced apart from one another in such a way as to be repeatedly arranged.

Referring to FIG. 6, the integrated SM pin 500 includes an upper plunger 510, a lower plunger 520, and an elastic part 530. Since the upper plunger 510 and the lower plunger 520 are similar to the upper plunger 110 and the lower plunger 120 of FIG. 2, a detailed description on the parts will be avoided.

The elastic part 530 is located between the upper plunger 510 and the lower plunger 520 to elastically support the upward and downward movements of the upper plunger 510 and the lower plunger 520. The elastic part 530 includes a first bent portion 531, a second bent portion 532, and a connector 533.

The first bent portion 531 includes a plurality of first bent members that are bent in a first direction. The second bent portion 532 includes a plurality of second bent members that are bent in a second direction as the opposite direction to the first direction. The first direction and the second direction are perpendicular to the movement directions of the upper plunger 510 and the lower plunger 520. The connector 533 is located between the first bent portion 531 and the second bent portion 532 to connect the first bent portion 531 and the second bent portion 532 so that the first bent portion 531 and the second bent portion 532 move independently.

Figure 7:
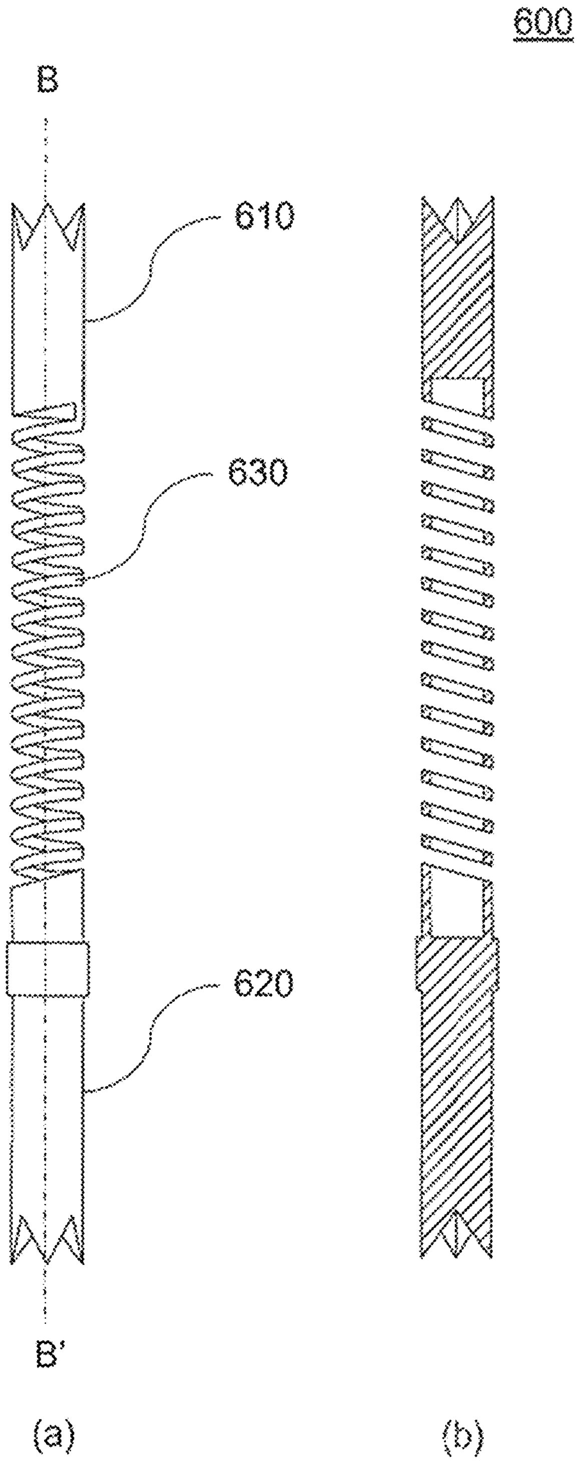
FIGS. 7 to 9 show examples of the probe pin manufactured using an additive manufacturing (AM) method.
Figure 8:
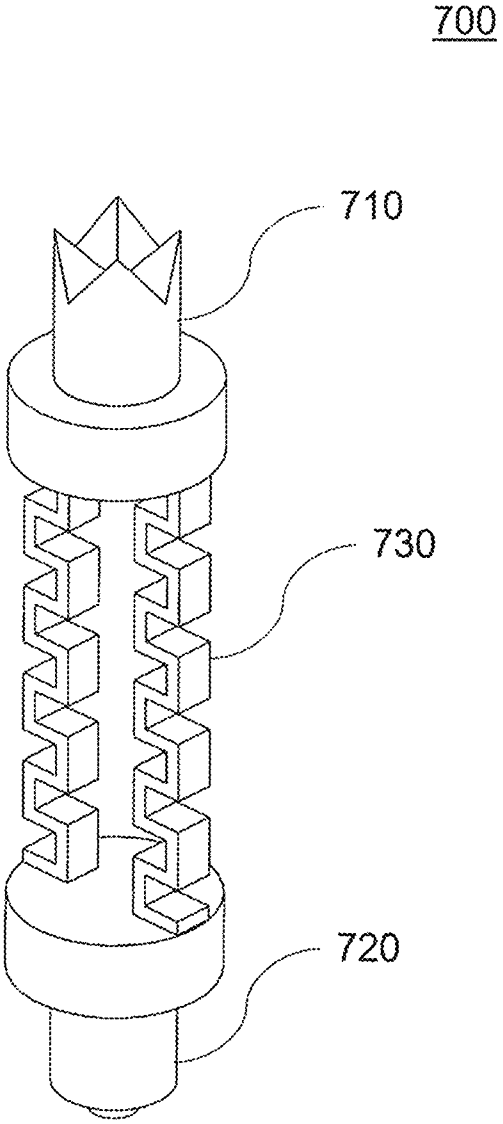
Figure 9:
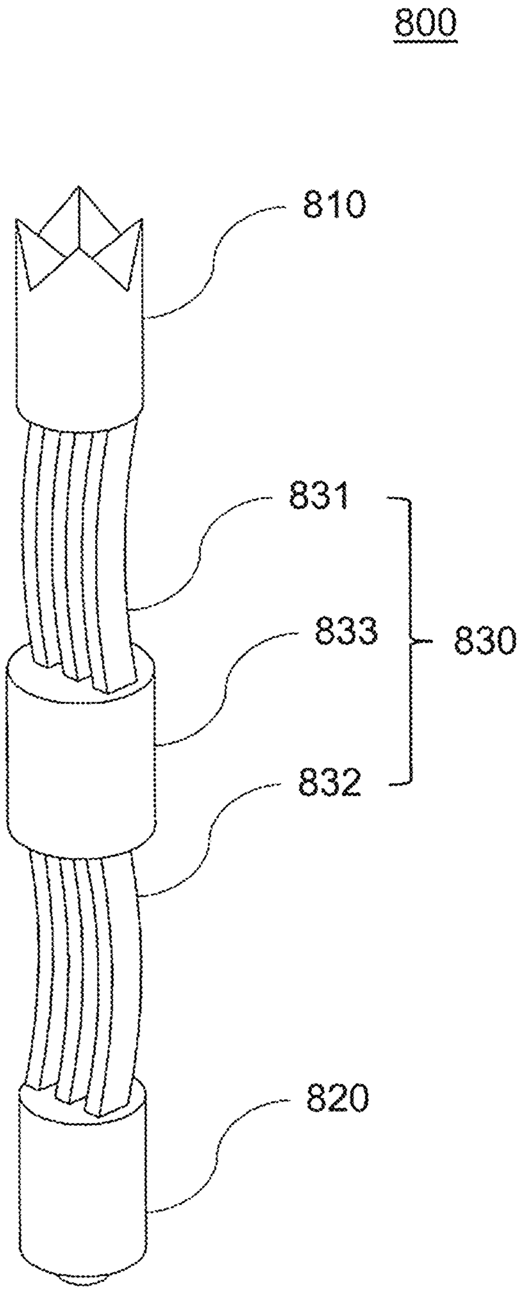

FIGS. 7 to 9 show examples of the probe pin made using an additive manufacturing (AM) method. FIGS. 7*a* and 7*b* are front and sectional views of an integrated AM pin 600, and FIGS. 8 and 9 are perspective views showing integrated AM pins 700 and 800 each having a combined structure.

Referring to FIGS. 7*a* and 7*b*, FIG. 7*a* is a front view of the integrated AM pin 600, and FIG. 7*b* is a sectional view taken along the line B-B' of the integrated AM pin 600. The integrated AM pin 600 includes an upper plunger 610, a lower plunger 620, and an elastic part 630. Since the upper plunger 610, the lower plunger 620, and the elastic part 630 are similar to the upper plunger 110, the lower plunger 120, and the elastic part 130 of FIG. 2, a detailed description on the parts will be avoided.

According to the embodiment of the present invention, the integrated AM pin 600 is manufactured through Fused Deposition Modeling (FDM), Selective Laser Sintering (SLS), Stereo-lithography (SLA), Laminated Object Manufacturing (LOM), etc. of the 3D printing. Referring to FIGS. 7*a* and 7*b*, the upper plunger 610 and the lower plunger 620 have crown-shaped tips, but the shapes of the tips may not be limited thereto.

The upper plunger 610 and the lower plunger 620 are different from the upper plunger 310 and the lower plunger 320 whose interiors are empty as shown in FIGS. 4*a* and 4*b* in that the interiors thereof are filled with metal materials. Accordingly, the SM pin 300 as shown in FIGS. 4*a* and 4*b* may be manufactured using the AM method, but the AM pin 600 as shown in FIGS. 7*a* and 7*b* may not be manufactured using the SM method.

Referring to FIGS. 8 and 9, each of the integrated AM pins 700 and 800 is manufactured to have a combined structure. The combined structure means a structure where a cylindrical structure and a plate structure are combined to each other. For example, the cylindrical structure means a structure with a circular cross-section in the direction perpendicular to the longitudinal direction of the probe pin, and the plate structure means a structure with a rectangular cross-section in the direction perpendicular to the longitudinal direction of the probe pin.

Referring to FIG. 8, the integrated AM pin 700 includes an upper plunger 710, a lower plunger 720, and an elastic part 730. The upper plunger 710 and the lower plunger 720 are cylindrical. Since the upper plunger 710 and the lower plunger 720 are similar to the upper plunger 110 and the lower plunger 120 of FIG. 2, a detailed description on the parts will be avoided.

The elastic part 730 is located between the upper plunger 710 and the lower plunger 720 to elastically support the upward and downward movements of the upper plunger 710 and the lower plunger 720. The elastic part 730 includes a plurality of elastic members. Each elastic member has a concavo-convex pattern in which a plurality of protrusions are spaced apart from one another in such a way as to be repeatedly arranged.

Referring to FIG. 9, the integrated AM pin 800 includes an upper plunger 810, a lower plunger 820, and an elastic part 830. The upper plunger 810 and the lower plunger 820 are cylindrical. Since the upper plunger 810 and the lower plunger 820 are similar to the upper plunger 110 and the lower plunger 120 of FIG. 2, a detailed description on the parts will be avoided.

The elastic part 830 is located between the upper plunger 810 and the lower plunger 820 to elastically support the upward and downward movements of the upper plunger 810 and the lower plunger 820. The elastic part 830 includes a first bent portion 831, a second bent portion 832, and a connector 833.

The first bent portion 831 includes a plurality of first bent members that are bent in a first direction. The second bent portion 832 includes a plurality of second bent members that are bent in a second direction as the opposite direction to the first direction. The first direction and the second direction are perpendicular to the movement directions of the upper plunger 810 and the lower plunger 820. According to the embodiment of the present invention, the first bent portion 831 and the second bent portion 832 have the shapes of plates.

The connector 833 is located between the first bent portion 831 and the second bent portion 832 to connect the first bent portion 831 and the second bent portion 832 so that the first bent portion 831 and the second bent portion 832 move independently. According to the embodiment of the present invention, the connector 833 is cylindrical.

As shown in FIGS. 8 and 9, each of the integrated AM pins 700 and 800 is configured to have the combined structure in which the cylinder and the plates are combined with one another. That is, probe pins having various shapes are manufactured using the AM method. Further, the integrated probe pins are manufactured using the AM method, and such probe pins have given length or under and are made of a single metal material. As a result, the probe pins are different in shape and miniaturized in size, without the degradation of the performance thereof.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention. It is therefore intended that the scope of the invention be limited not by this detailed description, but rather by the claims appended hereto.

The invention claimed is:

1. An integrated probe pin comprising:

an upper plunger having a first tip adapted to come into contact with a circuit to be inspected to transmit and receive electrical signals to and from the circuit to be inspected;

a lower plunger having a second tip adapted to come into contact with an inspection circuit to transmit and receive the electrical signals to and from the inspection circuit; and an elastic part located between the upper plunger and the lower plunger to elastically support the upper plunger and the lower plunger, wherein the upper plunger, the lower plunger, and the elastic part are manufactured as an integral body using 3D printing and made of one or more metal materials, wherein the elastic part comprises: a first layer having first concave portions and first convex portions alternately arranged to form a first ring; and a second layer having second concave portions and second convex portions alternately arranged to form a second ring, wherein the first layer and the second layer are sequentially disposed from the lower plunger toward the upper plunger through the 3D printing, and wherein the first concave portions contact the second convex portions and the first convex portions contact the second concave portions, such that the first ring and the second ring provide a current conduction path.

2. The integrated probe pin according to claim 1, wherein the first tip has the shape of a crown.

3. The integrated probe pin according to claim 1, wherein the second tip has the shape of a cone.

4. The integrated probe pin according to claim 1, manufactured to have a combined structure in which at least any one of a cylindrical structure and a plate structure is applied using an additive manufacturing (AM) method of the 3D printing.

5. The integrated probe pin according to claim 1, manufactured by machining a cylindrical metal pipe or rectangular metal plate using a subtractive manufacturing (SM) method of the 3D printing.

* * * * *